US011535698B2

(12) United States Patent
Czaplicki et al.

(10) Patent No.: US 11,535,698 B2
(45) Date of Patent: *Dec. 27, 2022

(54) ESTERIFIED ACIDS FOR USE IN POLYMERIC MATERIALS

(71) Applicant: Zephyros, Inc., Romeo, MI (US)

(72) Inventors: Michael Czaplicki, Rochester Hills, MI (US); Kevin Hicks, Harrison Township, MI (US)

(73) Assignee: Zephyros, Inc., Romeo, MI (US)

( * ) Notice: Subject to any disclaimer, the term of this patent is extended or adjusted under 35 U.S.C. 154(b) by 254 days.

This patent is subject to a terminal disclaimer.

(21) Appl. No.: 16/748,305

(22) Filed: Jan. 21, 2020

(65) Prior Publication Data
US 2020/0157275 A1 May 21, 2020

Related U.S. Application Data

(63) Continuation of application No. 15/551,348, filed as application No. PCT/US2016/023411 on Mar. 21, 2016, now Pat. No. 10,550,220.

(60) Provisional application No. 62/135,337, filed on Mar. 19, 2015, provisional application No. 62/208,236, filed on Aug. 21, 2015.

(51) Int. Cl.
C08G 59/40 (2006.01)
C08G 59/14 (2006.01)
C08J 9/04 (2006.01)
C08J 9/06 (2006.01)
C08J 9/12 (2006.01)
C08G 59/42 (2006.01)
C08J 9/08 (2006.01)
G01R 33/46 (2006.01)

(52) U.S. Cl.
CPC ..... *C08G 59/4071* (2013.01); *C08G 59/1488* (2013.01); *C08G 59/4269* (2013.01); *C08J 9/04* (2013.01); *C08J 9/06* (2013.01); *C08J 9/08* (2013.01); *C08J 9/12* (2013.01); *C08J 2201/022* (2013.01); *C08J 2203/02* (2013.01); *C08J 2363/00* (2013.01); *G01R 33/46* (2013.01)

(58) Field of Classification Search
None
See application file for complete search history.

(56) References Cited

U.S. PATENT DOCUMENTS

| | | |
|---|---|---|
| 2,541,027 A | 2/1951 | Bradley |
| 3,256,240 A | 6/1966 | Smith |
| 3,317,471 A | 5/1967 | Johnson et al. |
| 4,016,112 A | 4/1977 | Kajiura et al. |
| 4,164,487 A * | 8/1979 | Martin .................. C09D 163/00 427/195 |
| 4,196,270 A | 4/1980 | Chattha |
| 4,438,254 A | 3/1984 | Doorakian et al. |
| 4,613,661 A | 9/1986 | Langer |
| 4,619,860 A | 10/1986 | Brown et al. |
| 4,647,648 A | 3/1987 | Silvis et al. |
| 4,820,784 A | 4/1989 | Massingill, Jr. et al. |
| 4,992,525 A | 2/1991 | Kriessmann et al. |
| 5,086,094 A | 2/1992 | Massingill, Jr. |
| 5,115,075 A | 5/1992 | Brennan et al. |
| 5,331,080 A | 7/1994 | Swarup et al. |
| 5,552,070 A | 9/1996 | Schafer |
| 5,648,401 A | 7/1997 | Czaplicki et al. |
| 6,011,111 A | 1/2000 | Brennan et al. |
| 6,730,713 B2 | 5/2004 | Czaplicki |
| 7,087,663 B2 | 8/2006 | Feola et al. |
| 7,097,794 B2 | 8/2006 | McLeod et al. |
| 7,445,400 B2 | 11/2008 | Takeuchi |
| 7,579,068 B2 | 8/2009 | Allen et al. |
| 7,838,100 B2 | 11/2010 | McLeod et al. |
| 9,067,382 B2 | 6/2015 | Shepherd et al. |
| 9,187,592 B2 | 11/2015 | Finter et al. |
| 10,106,711 B2 | 10/2018 | Elgimiabi |
| 10,550,220 B2 * | 2/2020 | Czaplicki ........... C08G 59/4269 |
| 2002/0192387 A1 | 12/2002 | Agarwal et al. |
| 2003/0060523 A1 | 3/2003 | Czaplicki |
| 2004/0077801 A1 | 4/2004 | Feola et al. |
| 2007/0270515 A1 | 11/2007 | Chmielewski et al. |
| 2009/0298974 A1 | 12/2009 | Chmielewski et al. |
| 2018/0111349 A1 | 4/2018 | Polidore et al. |
| 2018/0155519 A1 | 6/2018 | Shepherd et al. |

FOREIGN PATENT DOCUMENTS

| | | |
|---|---|---|
| EP | 0188689 A2 | 7/1986 |
| EP | 0253005 A1 | 1/1988 |
| EP | 0288942 A2 | 11/1988 |
| EP | 2060592 | 5/2009 |
| EP | 2426160 | 9/2012 |
| EP | 2552992 B1 | 4/2017 |
| JP | S63-305121 A | 12/1988 |
| WO | 98/14498 | 4/1998 |
| WO | 2008/010823 A2 | 1/2008 |
| WO | 2014/198573 | 12/2014 |

OTHER PUBLICATIONS

European Communication dated Sep. 4, 2020, Application No. 16716983.8.
Chinese First Office Action dated Jul. 3, 2019, Application No. 201680028264.5.
India First Examination Report dated Jan. 30, 2020, Application No. 201737032259.
Chinese Second Office Action dated May 14, 2020, Application No. CN201680028264.5.

* cited by examiner

Primary Examiner — Michael J Feely
(74) Attorney, Agent, or Firm — The Dobrusin Law Firm, PC

(57) ABSTRACT

The present teachings contemplate a method that includes a step of providing a first amount of esterified reaction product of an acid and an epoxy-based material. The esterified reaction product may be further reacted an epoxy resin to form a polymeric epoxy. The resulting material may have a generally linear backbone, foaming and curing capability and flame retardant properties.

17 Claims, No Drawings

ESTERIFIED ACIDS FOR USE IN POLYMERIC MATERIALS

TECHNICAL FIELD

The present invention relates generally to polymeric materials, particularly to polymeric materials including an acid ester component to impart foam-in-place capability, improved flame retardancy characteristics, and/or curing capability which can be employed in a number of applications, such as in structural reinforcements and/or baffles for use in transportation vehicles.

BACKGROUND

In the transportation and construction industries, epoxy-based adhesives and foams are frequently used to provide structural support, sealing, and sound attenuation. For curing and expansion of such adhesives and foams, the addition of separate curing agents and blowing agents are typically required, adding expense and time for manufacture. Fire retardancy is also often desired, requiring additional agents for imparting the same.

Polymers having at least one epoxide group have been described in U.S. Pat. Nos. 5,115,075; 4,438,254; 6,011,111; and WO 98/14498 (see e.g., pages 3-8) along with illustrative synthesis conditions, all incorporated by reference herein (see also U.S. Pat. Nos. 3,317,471 and 4,647,648, also incorporated by reference herein). Examples of such materials also can be found, without limitation at paragraphs 15-25 of Published U.S. Patent Application No. 20070270515 (Chmielewski et al), incorporated by reference for all purposes.

U.S. Pat. No. 6,730,713 describes a material comprising an epoxy resin, phosphoric acid and a metal carbonate for forming a foam-in-place material. The use of the acid provides a desirable quick reaction for expansion and/or curing. However, the significant difference in viscosity between the phosphoric acid and the epoxy resin present significant challenges to both manufacturing and storage of the material.

The use of such polymers in a composite material has been disclosed in WIPO Patent Application WO/2008/010823 (addressing in situ reaction of an epoxy and an amine after impregnation), incorporated by reference herein. See also, United States Patent Application No. 20090298974 (incorporated by reference).

U.S. Pat. Nos. 4,992,525; 5,648,401; and 6,730,713 may also be relevant to the present teachings, and are all incorporated by reference for all purposes.

Notwithstanding the above teachings, there has remained a need for polymeric materials that are capable of foaming, curing and/or exhibiting flame retardant characteristics without the need for additional ingredients.

SUMMARY OF THE INVENTION

One or more of the above needs are met by the present teachings which contemplate a method and resulting materials that provide a polymeric material that has one or more flame retardant characteristics, curing capability, and/or is capable of foaming in place under ambient conditions, or upon contact with a stimulus. The present teachings contemplate a method that includes a step of providing a first amount of esterified reaction product of a phosphoric acid with any material suitable for forming a phosphoric acid ester. Such material may be an epoxide. Such material may be a reaction product of diepoxy and 9,10-Dihydro-9-Oxa-10-Phosphaphenantrene-10-oxide (DOPO). The esterified reaction product may be further reacted with an epoxy resin to form a polymeric material, which may be a thermoplastic epoxy. For example, the resulting material may be a polymer that includes an epoxide functionality and includes at least one phosphorus atom. The present teachings contemplate a method of reacting an acid ester with a combination of a metal carbonate and an epoxy resin to form a polymeric epoxy capable of foaming. The present teachings contemplate a method of reacting an acid ester with an epoxy resin to form a polymeric epoxy capable of curing with no additional curing agent.

In more particularity, the teachings contemplate a method that includes a step of providing a first amount of esterified reaction product of a phosphoric acid and a secondary material (which may be an epoxide) for forming an acid ester in a controlled manner for avoiding gelling, the esterified reaction product having a first viscosity that is higher than the viscosity of the phosphoric acid. The method also includes a step of providing a second amount of an epoxy resin suitable for reaction with the esterified reaction product, the epoxy resin having a second viscosity. A step of mixing of the esterified reaction product and the epoxy resin is performed in order to form a generally homogeneous mixture of reactants. The epoxy resin is reacted with the esterified reaction product to form a polymeric epoxy (e.g., a polymer that includes an epoxide functionality) that includes at least one phosphorus atom and has a weight average molecular weight of at least 10,000 daltons (e.g., as determined by titration).

The teachings herein further provide for a method for producing a foamed and/or cured article, comprising the steps of providing an epoxy resin formulation, providing an acid ester, and combining said resin formulation and said acid ester to form a reactive mixture and allowing said acid ester to catalyze polymerization of said resin formulation and react with a particulate to generate a blowing gas to form voids in said polymerized epoxy resin.

The teachings herein also provide for a method comprising providing a first amount of esterified reaction product of an phosphoric acid and an epoxide in a controlled manner for avoiding gelling, the esterified reaction product having a first viscosity that is higher than the viscosity of the phosphoric acid; providing a second amount of epoxy resin suitable for reaction with the esterified reaction product, the epoxy resin having a second viscosity; mixing the esterified reaction product and the epoxy resin to form a generally homogeneous mixture of reactants; and reacting the epoxy resin with the esterified reaction product to form a polymeric epoxy that includes at least one phosphorus atom and has a weight average molecular weight of at least about 10,000 Daltons.

It is possible that prior to the reacting step, the esterified reaction product and the epoxy resin are combined in a mixing step to form a generally homogeneous mixture of reactants. The first viscosity and the second viscosity may be such that during the step of mixing, homogeneity is achieved prior to a third viscosity being realized in the mixture that is higher than each of the first viscosity and second viscosity. The first amount of reaction product relative to the second amount of epoxy resin may be in a ratio of about 4:1 to about 1:4, or about 2:1 to about 1:2. The first amount of reaction product relative to the second amount of epoxy resin may be in a ratio of about 1:1. The esterified reaction product may have a pH of below about 3. The method may include a step of forming an esterified reaction product by reacting a monofunctional epoxide with a phosphoric acid. The reacting of a monofunctional epoxide with a phosphoric acid may include introducing an amount of monofunctional epoxide into a volume of phosphoric acid. The monofunctional epoxide may be an aliphatic and/or an aromatic epoxide. The monofunctional epoxide may have an epoxy equivalent weight of from at least about 25 g/mol to less than about 200 g/mol. The functionality of the phosphoric acid ester may be from at least about 1.5 to less than about 2.5. The resulting polymer may be a thermoplastic polymer. A step may be included for introducing a physical and/or a blowing agent so that the resulting polymer is a foam. The method may include a step of combining for reaction a stoichiometric excess amount of the esterified reaction product, relative to the epoxy resin, in the presence of an inorganic compound. The inorganic compound may be provided in an amount and under conditions to that it reacts with the esterified reaction product to form a gas and the esterified reaction product also reacts with the epoxide for aiding in curing. The epoxy resin and the inorganic compound may be mixed together and optionally stored together while the esterified reaction product is isolated from them prior to reaction. The inorganic compound may be an oxygen-containing compound, and/or may contain a metal or a metalloid. The inorganic compound may be a mineral. The inorganic compound may contain one or more of calcium, silicon, sodium, or some other alkali metal or alkali earth metal. The inorganic compound may be an oxide, a carbonate, a silicate, or any combination thereof. The epoxide may be provided for reaction as a liquid epoxy resin. The epoxy resin may have a functionality greater than 2 and less than 5. The epoxy resin may be provided in a liquid state. The epoxy resin may be provided in a solid state capable of being dissolved in a liquid. The epoxy resin may be provided in a solid state and dissolved in a liquid epoxy resin. The epoxy resin may be selected so that upon full expansion the epoxy resin resists shrink-back. The epoxy resin may be selected so that upon full expansion an expanded foam resin may not reduce in overall volumetric displacement or otherwise shrink by more than about 10% of its maximum displacement during or after activation for foaming. The epoxy resin may be selected so that upon full expansion an expanded foam resin an exterior surface of the expanded foam resin is substantially free of any concavity relative to the interior volume of the material occasioned by shrinking. The epoxy resin may be selected so that upon full expansion an expanded foam resin an exterior surface of the expanded foam resin is substantially free of any convexity relative to the interior volume of the material occasioned by shrinking.

The teachings herein further provide for a polymer made according to the methods described above. The polymer may be utilized for cavity filling, cavity reinforcement, acoustic modification, adhesives, flame retardant foam, flame retardant adhesive, flame retardant thermoplastics, or films. The polymer may exhibit sufficient flame retardancy to meet one or more of the requirements for demonstrating flame retardancy (e.g., to meet vertical burn and/or smoke density requirements (or some other requirement) as set forth in 14 C.F.R. § 25.853 and 14 C.F.R. § 25.856 (the United States Code of Federal Regulations for compartment interiors, including but not limited to 14 C.F.R. § 25.853(a), and the referenced Appendix F and procedures referenced therein). The polymer may be used to reduce particulated flame retardant usage in the material to attain flame retardancy performance as compared with a material without the polymer.

The teachings further provide for a method for producing a foamed article, comprising the steps of providing an epoxy resin formulation, said formulation comprising a pre-mixed epoxy resin and an encapsulated metal salt core; providing an esterified acid; and combining said resin formulation and said esterified acid to form a reactive mixture and allowing said esterified acid to catalyze polymerization of said resin formulation and react with a coated particulate to generate a blowing gas to form voids in the foamed article.

The teachings herein also contemplate a method comprising providing a first amount of esterified reaction product of an acid and a monoepoxy in a controlled manner for avoiding gelling, the esterified reaction product: (i) having a first viscosity that is higher than a viscosity of the acid; and (ii) including a plurality of monoesters and diesters, wherein the diesters are present in an amount of less than 25% of the amount of monoesters as measured by NMR.

The teachings herein further contemplate a foamable composition comprising a first esterified acid and a second esterified acid reacted with an epoxy-based material, wherein the composition is substantially free of any additional curing agent. The composition may be free of any additional blowing agent. The first esterified acid may be formed with phosphoric acid. The second esterified acid may be formed with phosphoric acid. Each esterified ester may include a plurality of monoesters and diesters, wherein the diesters are present in an amount of less than 25% of the amount of monoesters as measured by NMR.

The teachings herein also contemplate a reaction product in accordance with the disclosed method of the present teachings. The teachings herein further contemplate use of a phosphate ester as described herein as a curing agent in any epoxy-based material.

DETAILED DESCRIPTION

This application claims the benefit of the filing date of U.S. Provisional Application Ser. Nos. 62/135,337, filed on Mar. 19, 2015; and 62/208,236, filed on Aug. 21, 2015, the contents of these applications being hereby incorporated by reference for all purposes.

The present teachings contemplate the use of an acid ester material in combination with epoxy. The method may include a step of providing a first amount of esterified reaction product of a phosphoric acid and an epoxide. The esterified reaction product may be further reacted an epoxy resin to form a foamable, cured and/or flame resistant epoxy, which may be a thermoplastic epoxy. For example, the resulting epoxy may be a polymer that includes an epoxide functionality and includes at least one phosphorus atom. The resulting polymer may have a weight average molecular weight of at least about 10,000 daltons (e.g., as determined by titration). The resulting polymer reaction product of the teachings may thus be capable of exhibiting flame retardancy and/or foamable characteristics. For example, it may meet one or more of the requirements for demonstrating flame retardancy (e.g., to meet vertical burn and/or smoke density requirements (or some other requirement) as set forth in 14 C.F.R. § 25.853 and 14 C.F.R. § 25.856 (the United States Code of Federal Regulations for compartment interiors, including but not limited to 14 C.F.R. § 25.853(a), and the referenced Appendix F and procedures referenced therein), all of which are incorporated by reference for all purposes).

The present teachings provide for utilizing an acid ester as a replacement for an acid in creating epoxy-based materials capable of foaming-in-place and/or curing. More particularly, the composition of the present invention has two main components: (1) a resin, preferably a liquid resin or epoxy resin; and (2) an acid ester that is capable of initiating polymerization of the resin. The resin component may be further defined as having a core encapsulated by a polymer or other heat fusable substance such as a substrate to create a shell or skin. The core may consist of a salt, which may be a metal salt, and may be a metal carbonate encapsulated by a hydrocarbon, such as a polymer or wax. Although the core within the thermoplastic or the shell itself may further comprise an optional blowing agent formulated with the resin component, it is possible that no additional curing agent or blowing agent is required in the present invention. In this regard, it is contemplated that the acid ester component, when combined with the resin component (having the encapsulated core), initiates the curing process and gas generation. In addition, the acid ester may act as a fast curing agent while also maintaining the ability to fully cure thicker bondline materials. As an example, typical epoxy curing agents such as acrylates are only able to cure relatively thin sections of material (e.g., 3 mm or less), whereas the use of an acid ester curing agent allows for cure of thicker sections (e.g., 5 mm, 6 mm or greater).

The present teachings also contemplate a method that includes a step of providing a first amount of esterified reaction product of a phosphoric acid and an epoxide in a controlled manner for avoiding gelling, the esterified reaction product having a first viscosity that is higher than the viscosity of the phosphoric acid. The ester may be formed prior to or simultaneously with addition of the ester to the epoxy resin. The method also includes a step of providing an amount, which may be a second amount of an epoxy resin suitable for reaction with the esterified acid, the epoxy resin having a second viscosity. A step of mixing the esterified reaction product and the epoxy resin is performed in order to form a generally homogeneous mixture of reactants. The epoxy resin is reacted with the esterified reaction product to form a polymeric epoxy (e.g., a polymer that includes phosphorus and an epoxide functionality) that includes at least one phosphorus atom and has a weight average molecular weight of at least about 10,000; 15,000; or 20,000 daltons (e.g., as determined by titration).

The present teachings are also directed to a composition resulting from the combination of a diepoxy with 9,10-Dihydro-9-Oxa-10-Phosphaphenantrene-10-oxide (DOPO), which is then reacted with an acid (e.g., phosphoric acid) to form the acid ester described herein.

As seen, the teachings contemplate that one or more reactions are performed in order to arrive at the desired polymeric reaction product. A possible approach contemplates at least one reaction in which an esterified reaction product that includes at least one epoxide and phosphorus is reacted with an epoxy resin (e.g., a liquid epoxy resin) in order to achieve the desired polymeric epoxy that includes both phosphorus and an epoxide functionality. A possible approach may include a step of forming the esterified reaction product prior to and at a separate reaction facility (e.g., a different physical plant) from the step of reacting the esterified reaction product with the epoxy resin. A possible approach may include a step of forming the esterified reaction product prior to and within the same reaction facility (e.g., within the same physical plant) as the step of reacting the esterified reaction product with the epoxy resin (e.g., it is performed in two or more reactors that are in fluid communication with each other, so that the esterified reaction product can be flowed from its reaction vessel to a vessel within which it will react with the liquid epoxy resin.

Starting materials of the teachings herein may include a phosphoric acid, an epoxide (e.g., it may be included as part of an epoxide-containing compound) or other material suitable for forming the esterified acid, and a liquid epoxy resin. Though the use of "a" is employed herein, unless otherwise specified, or it is clear from the text, "a" envisions one or more.

The phosphoric acid may be a monophosphoric acid (e.g., orthophosphoric acid) or a polyphosphoric acid. The phosphoric acid may thus include a single phosphate atom or more than one. The phosphoric acid may include 3 or more reactive hydrogens.

The material for combining with the phosphoric acid to form the esterified reaction product (e.g., the reacting material) may be any material capable of reacting with the hydrogen of the phosphoric acid to form a di-functional molecule for reacting with an epoxy resin. It is also possible that the resulting ester is tri-functional, quatra-functional, or even penta-functional. The material for reacting with the acid may be an epoxide, which may be provided as part of an epoxide-containing compound. The epoxide may be a reaction product of two or more compounds. The epoxide may be of sufficient epoxide functionality so that the epoxide or epoxides will react with hydrogen of the phosphoric acid in a manner so that the resulting reaction provides a di-functional molecule capable of thereafter reacting with the epoxy resin to form a polymer with a generally linear backbone. The epoxide may be a monofunctional epoxide. The epoxide (e.g., a monofunctional epoxide) may be an aliphatic and/or an aromatic epoxide. The epoxide (e.g., a monofunctional epoxide) may have an epoxy equivalent weight of from at least about 25 g/mol to less than about 200 g/mol, as determined by ASTM D1652-11e1. The material for reacting with the acid may be a monoepoxy. In one non-limiting example, the reacting material may be 2-Ethylhexyl Glycidyl Ether, such as that sold by Emerald Performance Materials under the name Erisys GE-6. The reacting material may be an epoxidized CNSL (cashew nut shell liquid).

During the reaction between the acid and the reacting material, both monoesters and diesters may be formed in addition to an amount of hydroxyl alcohol by-product. Such by-product may be limited by increasing the amount of acid to cause the formation of additional esters with the by-product. It may be desirable to tailor the reaction to produce a reaction product comprising more monoesters as compared to diesters, given that the presence of monoesters result in increased reactivity for curing and for the production of gas for foaming. The amount of diesters present in the reaction product may be less than 50%, less than 25%, less than 10%, or even less than 5% the amount of monoesters as measured by nuclear magnetic resonance (NMR).

It is possible that the materials described herein utilize a combination of multiple esters. Each ester may be a reaction product of the same acid, or different acids. Each ester may be formed using different amounts of acids and reacting material in an effort to achieve a desired resulting quantity of monoesters and diesters (e.g., wherein the diesters are present in an amount less than the monoesters). A first esterified acid may be present in an amount of from about 20% to about 80% by weight, or even from about 50% to about 70% by weight of the total amount of esterified acids. A second esterified acid may be present in an amount of from about 20% to about 80% by weight, or even from about 20% to about 40% by weight of the total amount of esterified acids.

The selection of the phosphoric acid and the epoxide may be such that the functionality of the resulting esterified reaction product is from at least about 1.5 to less than about 2.5 (e.g., about 2, or about 2 or below).

By way of illustration, for a monophosphoric acid that includes three hydrogens, the reacting material may be monofunctional. In this manner it is possible that a di-functional esterified reaction product results. This di-functional reaction product can then be reacted with a suitable epoxy resin (e.g., a diepoxide) in suitable concentrations (e.g., at an approximately stoichiometric ratio) and under suitable reaction conditions to obtain a polymer with a generally linear backbone. In the event that a phosphoric acid is reacted with an epoxide, a thermoplastic material may be formed with one or more epoxies and one or more phosphorous atoms incorporated therein (e.g., by chemical bond).

The epoxy resin with which the esterified reaction product is reacted can be a suitable epoxy resin that will result, upon reaction with the esterified reaction product, in a generally linear backbone, possibly a thermoplastic material with one or more epoxies and one or more phosphorous atoms incorporated therein (e.g., by chemical bond). The epoxy resin may be a resin that includes a diepoxide. Examples of illustrative epoxy resins for use herein include bisphenol A, bisphenol F, Novolac resins and other similar resins. The epoxy resins may have an epoxy equivalent weight of from at least about 100 g/mol to less than about 250 g/mol, as determined by ASTM D1652-11e1. The epoxy resin may have a number average molecular weight of from about 350 to about 600 and, on average, each molecule of epoxy has from about 1.8 to about 2.5 epoxide functional groups. The preferred epoxy resin may have a viscosity of from about 5,000 to 100,000 cps (Brookfield viscosity) at 70° F. and a specific gravity of from about 1.0 to about 1.4. Exemplary epoxy resins which could be utilized in the present invention include polyglycidyl ethers obtained by reacting polyhydric phenols such as bisphenol A, bisphenol F, bisphenol AD, catechol, resorcinol, or polyhydric alcohols such as glycerin and polyethylene glycol with haloepoxides such as epichlorohydrin; glycidylether esters obtained by reacting hydroxycarboxylic acids such as p-hydroxybenzoic acid or beta-hydroxy naphthoic add with epichlorohydrin or the like; polyglycidyl esters obtained by reacting polycarboxylic acids such as phthalic acid, tetrahydrophthalic acid or terephthalic add with epichlorohydrin or the like; epoxidated phenolic-novolac resins (sometimes also referred to as polyglycidyl ethers of phenolic novolac compounds); epoxidated polyolefins; glycidylated aminoalcohol compounds and aminophenol compounds, hydantoin diepoxides and urethane-modified epoxy resins. Mixtures of epoxy resins may be used also in the present invention. For example, mixtures of liquid (at room temperature), semi-solid, and/or solid epoxy resins can be employed. The total amount of epoxy-based material may be from about 15% to about 60% by weight of the total resulting polymer composition.

The epoxy resin may be a combination of two or more resins. It may be a single resin. The epoxy resin may have a functionality greater than 2, (e.g., greater than 2.5, 3.0, or 3.5). The epoxy resin may have a functionality less than 5 (e.g., less than 4.5 or even less than 4.0). Desirably the epoxy resin will be provided in a liquid state, or in a solid state capable of being dissolved in a liquid such as a liquid resin (e.g., another epoxy resin). The viscosity of the epoxy resin under reaction conditions, room temperature, or both, may be below about 5000 centipoise (CPs) (in accordance with ASTM D445-15) The epoxy resin may be selected so that, in the case of forming a foam, upon full expansion the resin resists shrink-back. For example, an expanded foam resin may not reduce in overall volumetric displacement or otherwise shrink by more than about 10% of its maximum displacement during or after activation for foaming. Thus, an exterior surface of the resulting polymeric material may be characterized as being essentially free of any concavity relative to the interior volume of the material occasioned by shrinking. The exterior surface may be characterized by being essentially free of any convexities, relative to the interior volume of the material occasioned by shrinking.

It will be recognized that certain terminology is used herein for the naming of the epoxide-containing reactants. Simply because the reactant used for forming the esterified reaction product is called an epoxide does not foreclose the use of an epoxy resin as the epoxide source.

The phosphoric acid and the reacting material may be reacted at ambient temperature and pressure. The reaction conditions and the amounts of reactants may be such that the resulting esterified reaction product has an acidic pH, such as a pH of below about 5 (e.g., below about 3). However, the acid ester may have an acidity that is less than that of its counterpart acid, making handling and use less challenging. In addition, phosphoric acid has a very low hydrogen equivalent weight, which is disproportionate to that of epoxy. The use of the esterified phosphoric acid mitigates this inequality. A step of reacting the reacting material (for example, an epoxide) with a phosphoric acid may include introducing an amount of the material into a volume of phosphoric acid.

Prior to any step of reacting the esterified reaction product and the epoxy resin, the esterified reaction product and the epoxy resin may be combined in a mixing step to form a generally homogeneous mixture of reactants. For the reaction of the esterified reaction product and the epoxy resin, the amount of the esterified reaction product relative to the amount of epoxy resin may be in a ratio of about 4:1 to about 1:4 (e.g., about 2:1 to about 1:2). The reaction may be conducted under ambient conditions.

It is also possible that viscosities of the starting materials may be selected so that the esterified reaction product has a viscosity that is higher than the viscosity of the phosphoric acid. Further, during a step of mixing of the esterified reaction product and the epoxy resin, homogeneity may be achieved prior to a third viscosity being realized in the mixture that is higher than each of the viscosity of any of the individual reactants and/or the esterified reaction product.

As seen it is possible that the reaction to form the resulting epoxy materials of the teachings may employ a room temperature reaction, by which the resulting material will achieve a relatively non-flowable state relatively rapidly (e.g., less than about 15, 10 or even 5 minutes for a batch of at least about 10 kilograms of resulting material).

It is also contemplated that the teachings may be employed to make foam-in-place materials and/or materials capable of curing without the addition of a curing agent separate from the esterified reaction product. A chemical and/or physical blowing agent may be incorporated which liberates gas or otherwise forms and porous structure. Alternatively, the material may be formulated with a core encapsulated within or otherwise retained by a wax, thermoplastic shell, or skin. Although the other thermoplastic shell, the core, or both may further comprise a blowing agent, the material or formulation of the present invention does not require the presence of a blowing agent. The core encapsulated within the shell is one which is capable of reacting with the epoxy resin to promote a polymerization reaction that results in a controlled curing of the resin and which simultaneously reacts with the esterified reaction product to liberate a blowing gas. It is contemplated that the preferred core comprises an in-situ gas liberating agent such as a metal carbonate encapsulated by a wax or polymer and then mixed and formulated within the epoxy component of the present invention. The preferred metal carbonate core of the present invention is a particle or an aggregation of particles. Suitable cores for use in the present invention include alkali or alkaline earth metal salts, such as metal carbonates and metal bicarbonates and particularly preferred is calcium carbonate and anhydrous sodium bicarbonate. Since the metal carbonate core may not become part of the polymer network once cured, it is desirable to minimize the amount of metal carbonate used to maintain a degree of control and direction over the amount of foaming for the desired structural reinforcement application. Sufficient foaming may occur to reduce the density of the material by at least about 10, 30, 50 or even 70%, as compared with the material density in an unfoamed state. Suitable carbonates (e.g., an encapsulated carbonate (such as a metal carbonate (e.g., calcium carbonate encapsulated in a wax or polymeric coating) may be employed, consistent with the teachings of U.S. Pat. No. 6,730,713, incorporated by reference. Certain attributes of the foam (e.g., its rigidity and/or flexibility) can be easily modified in accordance with the present teachings depending upon the reacting material selected for esterification and the epoxy resin selected for forming the resulting polymeric material.

Another approach to creating a foamed material may include a step of introducing a physical and/or chemical blowing agent so that the resulting polymer is a foam. Suitable art-disclosed blowing agents may be employed in art-disclosed amounts. A possible approach may include a step of reacting the esterified reaction product and the epoxy resin in the presence of such a blowing agent. A two component system may be employed for creating a foamed material. A supply of the esterified reaction product (with or without the blowing agent) may be introduced in contact with a supply of the epoxy resin (with or without the blowing agent). The epoxy resin and the blowing agent may be mixed together and optionally stored together while the esterified reaction product is isolated from them prior to reaction. Other blowing agents may include one or more of an organic and/or inorganic compound that is capable of decomposing to yield a gas (e.g., carbon dioxide). One or more of the blowing agents may be selected to selectively control a reaction rate between the epoxy resin and the esterified reaction product. Any of the blowing agents may be provided in a solid state. For example, they may be as a plurality of individual solid elements (e.g., particles, fibers, flakes or coated onto or within one or more individual solid elements). The plurality of individual solid elements may have one or more sizes and/or dimensions (e.g., diameter, aspect ratio, or otherwise). The one or more individual solid elements may be provided in a multi-modal size and/or dimension distribution. They may be provided in a relatively broad distribution. Examples may include mean particle sizes of about X microns and about Y microns by sieve, where X and Y may be different (e.g., X and Y may be different by an order of magnitude; X may be at least 2Y, 3Y, 4Y or more). The inorganic compound useful as a blowing agent may be a mineral, it may be a ceramic. It may be an oxygen-containing compound. It may contain a metal or a metalloid. It may contain one or more of calcium, silicon, sodium, or some other alkali metal or alkali earth metal. By way of example, without limitation it may be an oxide, a carbonate, a silicate, or any combination thereof. Particular examples may include feldspar and wollastonite.

It is possible that for the reaction, a stoichiometric or a stoichiometric excess amount of the esterified reaction product is provided for contact with the epoxy resin, which may be in the presence of a carbonate. If a stoichiometric excess amount of the esterified reaction product is provided for contact with the epoxy resin it is possible that the esterified reaction product will serve not only as a reactant, but at least a portion may serve as a curative. That is, the carbonate (or blowing agent) may be provided in an amount and under conditions so that it reacts with the esterified reaction product to generate a gas and the esterified reaction product also reacts with the epoxide for aiding in curing of the polymer.

Various attributes of the teachings herein may be gleaned from the above. By way of example, the reactants, the reaction products or each, of the teachings, may be substantially free (e.g., less than 3%, 2%, 1% or 0.5% by weight), or entirely free, of any halogenated constituents, of any 9,10-dihydro-9-oxa-10-phosphaphenanthrene-10-oxide (DOPO), of any particulated flame retardant, or any combination thereof. A benefit of the teachings is that a flame retardant chemical constituent is chemically bonded as a part of a polymeric material of the teachings. The teachings herein may be free of any step of reacting an amine with any of the reaction products. The teachings herein may be free of any step of forming any amine adduct. The materials described herein may be free of or substantially (e.g., less than 3%, 2%, 1% or 0.5% by weight) free of any additional curing agent beyond the acid ester.

Materials made herein have a number of applications, and the teachings contemplate use of the materials in such applications as well as articles made with the materials and adapted for use in such applications. By way of example, the teachings herein can be employed for filling and/or structurally reinforcing a cavity (e.g., of a transportation vehicle, such as a cavity of a vehicle body frame). Materials herein may be employed as an adhesive. They may be employed as a structural reinforcement material. They may be employed as a material for acoustic modification, for adhesive bonding, as a flame retardant foam, as a flame retardant adhesive, as a flame retardant thermoplastic, as a film or any combination thereof.

Use of the teachings herein may result in a material that exhibits sufficient flame retardancy to meet one or more of the requirements for demonstrating flame retardancy (e.g., to meet vertical burn and/or smoke density requirements (or some other requirement) as set forth in 14 C.F.R. § 25.853 and 14 C.F.R. § 25.856 (the United States Code of Federal Regulations for compartment interiors, including but not limited to 14 C.F.R. § 25.853(a), and the referenced Appendix F and procedures referenced therein), all of which are incorporated by reference for all purposes).

Use of the teachings herein may result in a material that exhibits reduced (e.g., by at least 50, 70 or 90% (taking into account weight) of particulated flame retardant usage in the material to attain flame retardancy performance as compared with a material without the material of the present teachings.

The teachings herein also contemplate formulations that include a mixture of a material of the teachings with a filler (e.g., an organic filler, an inorganic filler or both), a reinforcement (e.g., an organic fiber, an inorganic fiber, or both), a colorant, a light stabilizer, a processing aid, or otherwise. For possible ingredients, see e.g., U.S. Pat. Nos. 5,648,401, and 6,730,713, both incorporated by reference.

A non-limiting example formulation in accordance with the teachings herein is provided below at Table 1:

TABLE 1

| Material | Amount (wt. %) |
|---|---|
| Component A: | |
| Liquid Epoxy Resin | 21.70 |
| Flexible Epoxy Resin | 14.15 |
| Epoxy phenol novolac resin | 37.74 |
| Calcium Carbonate | 20.75 |
| Wollastonite | 5.19 |
| Silica | 0.47 |
| Component B: | |
| Acid Ester #1 | 62.04 |
| Acid Ester #2 | 24.07 |
| Silica | 1.85 |
| Calcined Kaolin | 12.04 |
| Acid Ester #1: | |
| Epoxidized CNSL | 79.30 |
| 85% Phosphoric Acid | 20.70 |
| Acid Ester #2: | |
| 2-Ethylhexyl Glycidyl Ether | 65.40 |
| 85% Phosphoric Acid | 34.60 |

While the materials described herein can be utilized in applications where polyurethane foams are typically used, these materials also provide significant improvements over polyurethane foams. For example, the use of epoxy provides improved strength (e.g., compression modulus, tensile strength) as compared to polyurethane foams. In addition, the use of the acid ester material provides flame resistance characteristics (without the use of halogenated materials) and improved adhesion durability (whereas polyurethane foam generally provide little to know adhesive characteristic). Epoxy foams are also more resistant to hydrolysis as compared to polyurethane foams. In addition, the isocyanate component of polyurethane foams may be highly regulated.

As used herein, unless otherwise stated, the teachings envision that any member of a genus (list) may be excluded from the genus; and/or any member of a Markush grouping may be excluded from the grouping.

Unless otherwise stated, any numerical values recited herein include all values from the lower value to the upper value in increments of one unit provided that there is a separation of at least 2 units between any lower value and any higher value. As an example, if it is stated that the amount of a component, a property, or a value of a process variable such as, for example, temperature, pressure, time and the like is, for example, from 1 to 90, preferably from 20 to 80, more preferably from 30 to 70, it is intended that intermediate range values such as (for example, 15 to 85, 22 to 68, 43 to 51, 30 to 32 etc.) are within the teachings of this specification. Likewise, individual intermediate values are also within the present teachings. For values which are less than one, one unit is considered to be 0.0001, 0.001, 0.01, or 0.1 as appropriate. These are only examples of what is specifically intended and all possible combinations of numerical values between the lowest value and the highest value enumerated are to be considered to be expressly stated in this application in a similar manner. As can be seen, the teaching of amounts expressed as "parts by weight" herein also contemplates the same ranges expressed in terms of percent by weight. Thus, an expression in the of a range in terms of "at least 'x' parts by weight of the resulting composition" also contemplates a teaching of ranges of same recited amount of "x" in percent by weight of the resulting composition."

Unless otherwise stated, all ranges include both endpoints and all numbers between the endpoints. The use of "about" or "approximately" in connection with a range applies to both ends of the range. Thus, "about 20 to 30" is intended to cover "about 20 to about 30", inclusive of at least the specified endpoints.

The disclosures of all articles and references, including patent applications and publications, are incorporated by reference for all purposes. The term "consisting essentially of to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist of, or consist essentially of the elements, ingredients, components or steps.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

It is understood that the above description is intended to be illustrative and not restrictive. Many embodiments as well as many applications besides the examples provided will be apparent to those of skill in the art upon reading the above description. The scope of the invention should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. The omission in the following claims of any aspect of subject matter that is disclosed herein is not a disclaimer of such subject matter, nor should it be regarded that the inventors did not consider such subject matter to be part of the disclosed inventive subject matter.

What is claimed is:

1. A two component system for creating a foamed material of a polymeric epoxy, the two component system comprising:
   a first component comprising at least one epoxy resin and at least one blowing agent; and
   a second component comprising at least one esterified reaction product formed by reacting a phosphoric acid and an epoxide;
   wherein the at least one esterified reaction product of the second component has a first viscosity that is higher than the viscosity of the phosphoric acid;
   wherein the at least one epoxy resin of the first component has a second viscosity and is suitable for reaction with the at least one esterified reaction product;
   wherein the amount of the at least one esterified reaction product in the second component and the amount of the at least one epoxy resin in the first component are sufficient to produce the polymeric epoxy, wherein the polymeric epoxy includes at least one phosphorus atom and has a weight average molecular weight of at least about 10,000 daltons; and wherein the foamed material resulting from combining and reacting the first and second components has flame retardant properties and is suitable for cavity filling, cavity reinforcement, acoustic modification, and adhesive bonding.

2. The two component system of claim 1, wherein the foamed material resulting from combining and reacting the first and second components exhibits sufficient flame retardancy to meet vertical burn and smoke density requirements as set forth in 14 C.F.R. § 25.853 and 14 C.F.R. § 25.856 (the United States Code of Federal Regulations for compartment interiors).

3. The two component system of claim 1, wherein the at least one blowing agent of the first component comprises an inorganic compound capable of decomposing to yield a gas.

4. The two component system of claim 3, wherein the inorganic compound capable of decomposing to yield a gas is a carbonate.

5. The two component system of claim 3, wherein the inorganic compound capable of decomposing to yield a gas contains one or more of calcium, silicon, sodium, or some other alkali metal or alkali earth metal.

6. The two component system of claim 1, wherein the epoxide used to form the at least one esterified reaction product of the second component is a liquid epoxy resin.

7. The two component system of claim 1, which does not contain any additional curing agent.

8. The two component system of claim 1, wherein the at least one blowing agent of the first component comprises a physical blowing agent and/or a chemical blowing agent.

9. The two component system of claim 1, wherein the at least one blowing agent of the first component does not require an addition of a stimulus.

10. The two component system of claim 1, wherein the at least one blowing agent of the first component requires exposure to elevated temperatures.

11. A foamed material resulting from combining and reacting the first and second components of the two component system of claim 1.

12. The two component system of claim 1, wherein the at least one esterified reaction product of the second component includes a plurality of monoesters and diesters, wherein the diesters are present in an amount of less than 25% of the amount of monoesters as measured by NMR.

13. A foamed material resulting from combining and reacting the first and second components of the two component system of claim 12.

14. The two component system of claim 1, wherein the amount of the at least one esterified reaction product in the second component and the amount of the at least one epoxy resin in the first component are sufficient to produce the polymeric epoxy, wherein the polymeric epoxy includes at least one phosphorus atom and has a weight average molecular weight of at least about 15,000 daltons.

15. A foamed material resulting from combining and reacting the first and second components of the two component system of claim 14.

16. The two component system of claim 1, wherein the amount of the at least one esterified reaction product in the second component and the amount of the at least one epoxy resin in the first component are sufficient to produce the polymeric epoxy, wherein the polymeric epoxy includes at least one phosphorus atom and has a weight average molecular weight of at least about 20,000 daltons.

17. A foamed material resulting from combining and reacting the first and second components of the two component system of claim 16.

* * * * *